US006271780B1

(12) United States Patent
Gong et al.

(10) Patent No.: US 6,271,780 B1
(45) Date of Patent: Aug. 7, 2001

(54) GAIN RANGING ANALOG-TO-DIGITAL CONVERTER WITH ERROR CORRECTION

(75) Inventors: Xue-Mei Gong, Austin, TX (US); Ka Yin Leung, Tucson, AZ (US); Eric J. Swanson, Buda, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/168,601

(22) Filed: Oct. 8, 1998

(51) Int. Cl.[7] ............................................ H03H 1/88
(52) U.S. Cl. ............................... 341/139; 341/155
(58) Field of Search .................................... 341/155, 144, 341/139, 132; 381/102, 103, 71

(56) References Cited

U.S. PATENT DOCUMENTS

| | | | |
|---|---|---|---|
| 4,010,462 | 3/1977 | Armistead | 340/347 |
| 4,383,247 | 5/1983 | Assard | 340/347 |
| 4,393,369 | 7/1983 | Davies | 340/347 |
| 4,399,416 | 8/1983 | Gillespie | 330/86 |
| 4,581,595 | * 4/1986 | Silagi | 333/139 |
| 4,584,558 | 4/1986 | Maschek et al. | 340/347 |
| 4,674,062 | 6/1987 | Premerlani | 364/602 |
| 4,817,167 | * 3/1989 | Gassmann | 381/3 |
| 4,851,842 | 7/1989 | Iwamatsu | 341/139 |
| 4,999,628 | 3/1991 | Kakubo et al. | 341/139 |
| 5,031,193 | * 7/1991 | Atkinson et al. | 375/13 |
| 5,245,665 | * 9/1993 | Lewis et al. | 381/71 |
| 5,506,910 | * 4/1996 | Miller et al. | 381/103 |
| 5,821,889 | * 10/1998 | Miller | 341/139 |
| 5,878,335 | * 3/1999 | Kushner | 455/260 |
| 5,999,802 | * 12/1999 | Aschwanden | 455/196.1 |
| 6,097,324 | * 8/2000 | Myer et al. | 341/118 |

OTHER PUBLICATIONS

"20 Bit A–to–D & D–to–A Converting Systems for Digital Audio," Yasunori Tani, Kozo Nuriya, Nobuyuki Seki and Tetsuhiko Kaneaki, IEEE Transactions on Consumer Electronics, vol. 35, No. 3, Aug. 1989, pp. 528–535.

"20 Bit A–to–D & D–to–A Converting Systems for Digital Audio", Y. Tani, K. Nuriya, N. Seki and T. Kaneaki, IEEE 1989 International Conference on Consumer Electronics, Digest of Technical Papers, Jun. 6–9, 1989, pp. 210–211.

* cited by examiner

*Primary Examiner*—Peguy Jeanpierre
(74) *Attorney, Agent, or Firm*—Howison, Chauza, Handley and Arnott LLP

(57) ABSTRACT

A gain ranging AD converter is provided having two separate gain paths. There is provided a low-gain path and a high-gain path. The low gain path is processed through an analog modulator (333) and then through a filter section to provide on an output of a high-pass filter (339), a low-gain signal which is then compensated for in an equalizer section (347). This equalizing section (347) calibrates the output signal to ensure that the difference between the calibrated signal and the high-gain signal differs only by the fixed gain between the two paths. The high-gain path also includes a modulator (335) for processing through a filter section to provide on the output of a high-pass filter section (343) a high-gain signal. A calibration generator (361) is utilized to generate the parameters for performing the equalization. This calibration generator (361) utilizes both phase and amplitude information from the high-gain path and from both the calibrated low-gain path to generate the calibration parameters for use by the equalizing section (347). Thereafter, the mixing operation is performed to provide a "blend" before summing with a summing junction (351).

36 Claims, 5 Drawing Sheets

GAIN RANGING ANALOG-TO-DIGITAL CONVERTER WITH ERROR CORRECTION

TECHNICAL FIELD OF THE INVENTION

The present invention pertains in general to Analog-to-Digital Converters and, more particularly, to a Gain Ranging Analog-to-Digital Converter.

BACKGROUND OF THE INVENTION

In order to increase the dynamic range for Analog-to-Digital Converters, a technique known as "gain ranging" has been utilized. This technique requires two data conversion paths, each path having a different amplification associated therewith. A threshold detector determines the signal level on the input and then defines the signal path that is to be utilized. If it is below a defined low signal level threshold, the high gain path is utilized, and if it is above a predetermined high signal level threshold, the high gain path is utilized. If the signal level is detected as being between the two thresholds, then a "blending" of the two signals can be facilitated.

One disadvantage to the above-noted gain ranging technique is that, when the two digital signals are combined in the blending operation, it is important to ensure that the two paths have the same magnitude, phase and DC off-set characteristics. The DC off-set can be removed with a high pass filter in each path. However, any remaining mismatch due to gain or phase mismatch can result in audible distortion. It is this gain mismatch and phase mismatch that must be corrected for in order to ensure that the combining of the two digital outputs is achieved correctly to prevent such distortion.

SUMMARY OF THE INVENTION

The present invention disclosed and claimed herein comprises a digital microphone system including a gain ranging analog-to-digital convertor. The analog-to-digital convertor is operable to convert an analog signal to a digital signal and process a digital signal in the digital domain. During this conversion operation, a digital processing system is operable to detect the magnitude of this signal and vary the conversion gain thereof as a function of the magnitude of the signal. At least two digital signals are combined in this operation to yield a resulting digital signal with the combining operation including a phase equalization operation performed between the two combined signals to minimize distortion in the audio signal in the analog domain corresponding to the resulting digital signal in the digital domain.

In another aspect of the present invention, the analog-to-digital convertor comprises a high gain conversion path and a low gain conversion path, the high gain path imparting a first gain thereto and the low gain path imparting a second gain thereto lower than the first gain. A proportionality device is provided for varying the gain in at least one of the paths relative to the other of the paths. A summing device then sums the output of the high gain path and the low gain path with a controller controlling the proportionality device to determine the amount of signal to be summed from each of the high and low gain paths in accordance with a predetermined summing profile. An equalizer is provided in one of the paths for adjusting the fade between the high and low gain paths to minimize distortion in the resulting signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
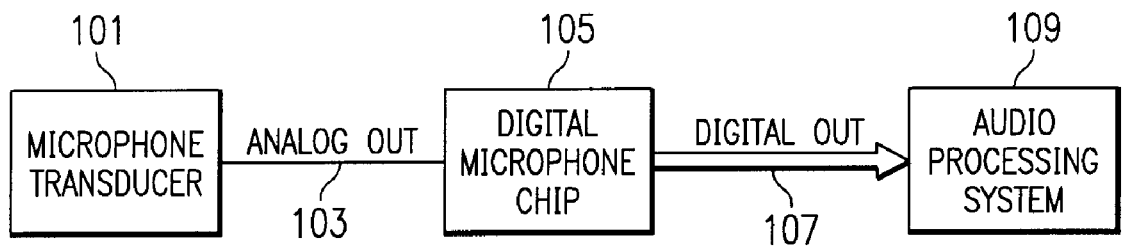
FIG. 1 illustrates an overall block diagram of the digital microphone chip disposed between an analog microphone transducer and an audio processing system.

Referring now to FIG. 1, there is illustrated a block diagram of an audio system which includes a microphone transducer 101 for converting sound into an analog signal on line 103. This microphone transducer 101 is any type of conventional microphone that will convert sound waves into electrical signals. This analog signal on line 103 is input to a digital microphone integrated circuit or chip 105 for conversion to a digital signal for output on a digital bus 107. Once converted to the digital signal, the digitized sound can then be transmitted over significantly longer distances without being susceptible to noise as compared to an analog transmission over the same distance. With the digitized signal transmitted on the bus 107, no twisted pair wires are required to prevent such noise contamination. This digital signal is an input to an audio-processing system 109. This audio-processing system 109 can be any type of audio-processing system, such as an amplifier, a public address system or a recording device. The digital microphone chip 105 is designed to be disposed in close proximity with the microphone transducer 103 to ensure that the length of the analog line 103 between the microphone transducer 101 and the digital microphone chip 105 is relatively short to minimize the amount of noise that can be picked up on the analog output line 103.

Figure 2:
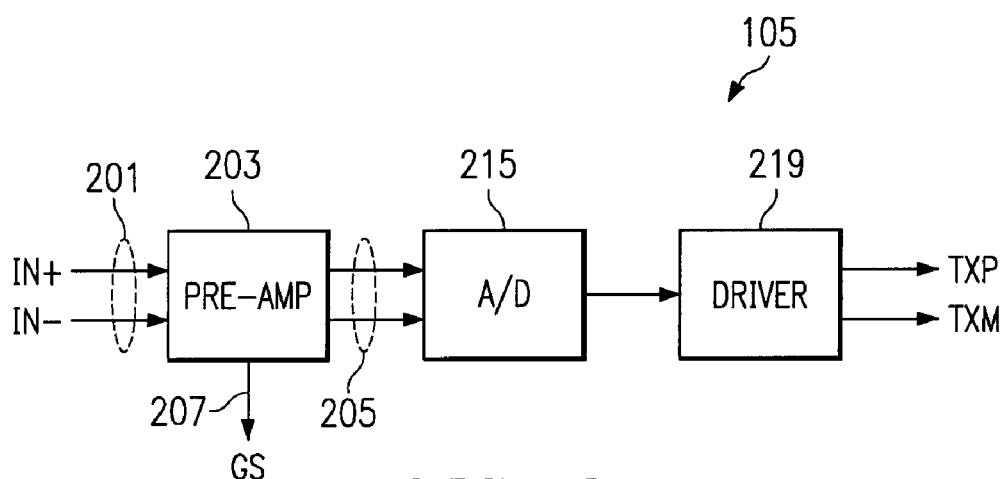
FIG. 2 illustrates an overall block diagram of the digital microphone chip.

Referring to FIG. 2, there is illustrated a block diagram of the digital microphone chip 105 in FIG. 1. The analog signal is input on one or two input lines 201, which allow either single-ended audio to be received, or audio on a differential pair such as a twisted wire pair to be received. This is input to a pre-amplifier 203 that amplifies the small signal output of the microphone transducer 101. The pre-amplifier 203 is an ultra low noise (0.9 nV/sqrtHz) with a low distortion on the order of −100 dB. The output of the pre-amplifier 203 is a differential output on lines 205. The gain of the amplifier 203 is selectable between a 0 dB level and a 20 dB level with an input control GS received on a line 207. The output of amplifier 203 on lines 205 are input to an analog-to-digital (A/D) converter 215.

The A/D converter 215 is operable to convert the analog signal on the output of the pre-amplifier 203 into a 24-bit digital data stream. It has a dynamic range of approximately 138 dB, which, together with the 20 dB gain adjustment in the pre-amplifier 203, enables the digital microphone chip 105 to accommodate 158 dB of the microphone transducer's 101 dynamic range. The A/D converter 215 internally consists of a delta-sigma modulator and a decimation filter, as will be described hereinbelow. Further, as described hereinbelow, the A/D converter 215 is realized with a gain ranging structure requiring two paths with two A/D conversion devices with two analog modulators and two decimation filters.

The digital output of the A/D converter 215 is input to a driver 219, which is operable to encode and transmit the 24-bit data in accordance with the AES\EBU or S\PDIF interface standards. This requires some extra bits, which extra bits carry information pertinent for a playback process. For example, error protection, specification for sampling frequency, use of pre-emphasis, table of contents and even copyright information can be provided. The driver 219 is a line driver that is a low skew, low impedance driver with differential outputs capable of driving a transmission line with an impedance of 110 Ohms with a 4 volt peak-to-peak signal. The output of driver 219 is provided on a differential pair of lines 227.

Figure 3:
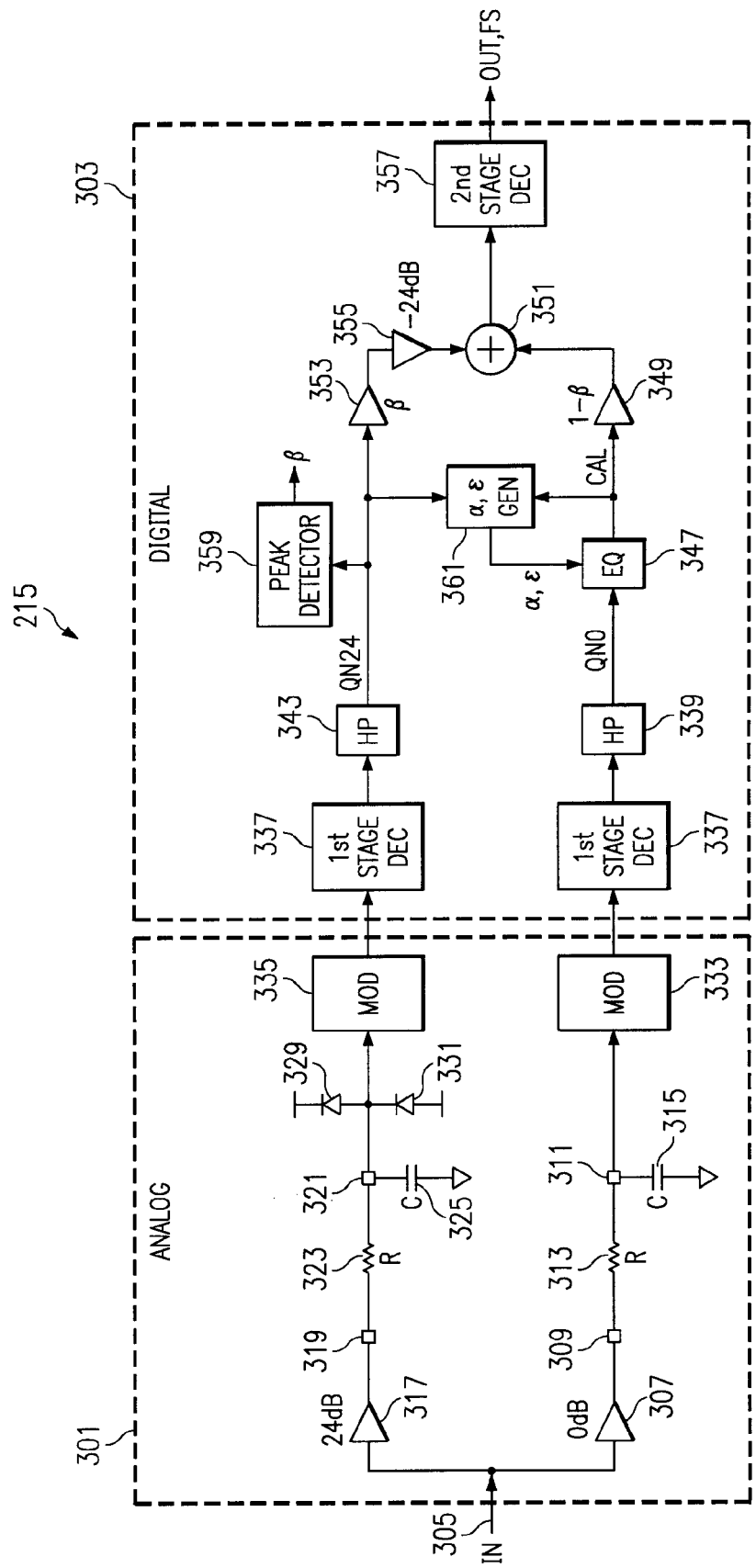
FIG. 3 illustrates a detailed block diagram of the analog-to-digital converter.

Referring now to FIG. 3, there is illustrated a block diagram of the A/D converter 215. The A/D converter 215, in the preferred embodiment, is segmented into an analog section 301 and a digital section 303. However, the A/D converter 215 could be manufactured with a single section. In the analog section 301, an analog input signal is received on an analog input line 305 and is then divided into two paths. The first path is referred to a "0 dB" path and the second path is referred to as a "24 dB" path, it being noted that the difference between the two paths is what is referred to by these values.

In the 0 dB path, the input line 305 is connected to the input of a first pre-amplifier 307, the output thereof connected to a terminal 309 on the chip. The terminal 309 interface is associated with a second terminal 311 such that a resistor 313 can be disposed therebetween. A capacitor 315 can be disposed between the terminal 311 and ground. The resistor 313 and the capacitor 315 are external components and comprise a low pass filter. Similarly, the second path, the 24 dB path, is comprised of pre-amplifier 317 that provides a gain of 24 dB, although any gain could be provided. Additionally, there could be a pre-amplifier in the "0" db path having a predetermined gain and the pre-amplifier 317 would then have its gain adjusted by the gain of the pre-amplifier in the 0 db path, such that the difference is 24 db. The output of pre-amplifier 317 is connected to a terminal 319 on the integrated circuit, which is associated with a second terminal 321. Terminals 319 and 321 can have a resistor 323 disposed therebetween with a capacitor 325 connected between terminal 321 and ground. Capacitor 325 and resistor 323 are external components and comprise a low pass filter.

The 24 dB path, for large signals, presents the possibility of saturation. To accommodate this, a "clipper" circuit is provided. This is realized in one embodiment with a first diode 329 connected between terminal 321 and the positive supply and a second diode 331 connected between terminal 321 and ground. Diode 329 is configured such that it will conduct only when the voltage on 321 is higher than the positive supply by the forward bias voltage of the diode 329 and diode 331 is configured such that it will conduct only when the voltage on terminal 321 is lower than ground by the forward bias voltage of the diode 331. This will effectively prevent a voltage greater than the forward bias voltage of diodes 331 and 329 from being placed on terminal 321.

Although this clipper circuit has been illustrated utilizing diodes as the "clipping" devices, it should be understood that any protection device could be utilized to limit the voltage and to prevent an overvoltage condition from occurring. This could be any type of active device such as an MOS transistor that can be turned on in the presence of an out of tolerance voltage to shunt current away from the input. Additionally, it is noted that the input signal is illustrated as being a single-ended input. A differential input could also be utilized.

The 0 dB path has the terminal 311 connected to the input of an analog modulator 333 which, in the preferred embodiment, is a delta-sigma analog modulator, although any type of analog modulator could be utilized. Similarly, the 24 dB path has the terminal 321 connected to the input of an analog modulator 335. The delta-sigma modulators are each a seven-order analog modulator with a tri-level quantizer, in the preferred embodiment, although other types of quantizers could be utilized such as a one bit quantizer. The output of modulator 333 is input to a decimation filter comprised of a first stage of decimation 337, and then to a high pass filter 339 which provides high pass filtering. Similarly, the output of modulator 335 in the 24 dB path is input to a first state of decimation 341 which is then processed through a high pass filter section 343.

The filter comprised of the first stage decimation filter 337 and the high pass filter 339 and the first stage decimation filter 341 and the high pass filter 343 together with a second stage decimation filter (described hereinbelow) will perform the rate conversion to send out digital data at a rate of either 48 kHz, 96 kHz or 44.1 kHz. The 96 kHz sampling rate is supported based on the fact that the sound quality of 96 kHz sampling is considered to be more natural and clear, and the atmosphere of the recording session is better preserved. Although not illustrated, an input master clock frequency is provided operating at 12.288 mHz or some other rate. The decimation filter will then be able to provide a 120 dB anti-aliasing rejection ratio as well as 120 dB stop-band rejection. The pass band frequency response will essentially be flat and the transition band will be relatively sharp but smooth. The high pass filter sections 339 and 343 are utilized to remove the DC offset introduced either by the chip input or by the modulator's mismatched components. Therefore, in the output of the high pass filters 339 and 343, there is provided a 24-bit digital value. The output of the filter 339 in the 0 dB path is processed with an equalizer block 347 to provide a calibrated output. The calibrated output is then input to a fading block 349 and then into the input of a summing junction 351. The output of the filter 343 in the 24 dB path is input to a fading block 353 and then to a compensation buffer 355 to attenuate 24 dB therefrom and then to the input of the summing block 351. The summing block 351 is operable to sum the signals from both paths and provide a digital output to a second stage decimation filter 357, the output thereof being the sampled digital data.

When the input signal amplitude is between 0 dB to −27 dB, which causes the high gain path to saturate or operate close to saturation, the digital output is derived solely from the low gain or 0 dB path. When the input amplitude is below −51 dB, the digital output is solely from the high gain path or the 24 dB path. When the input amplitude is between −27 dB to −51 dB, the output is a mixture of the digital data from the two paths. This mixing is done in a "fading" fashion according to the following equation:

$$D_{out} = \beta \times D_{24} + (1-\beta) \times D_0$$

where $D_{out}$ is the composite digital signal

β is the fading parameter that varies from a value of zero to one, $D_{24}$ is the digital data on the 24 dB path, and $D_0$ is the digital data on the 0 dB path.

The value of β is determined through the use of peak detector 359. This peak detector 359 measures the signal output from the filter 343 on the 24 dB path.

When the input amplitude changes from −27 dB to −51 dB, the contribution of the high gain path increases linearly proportional to the signal amplitude, and the contribution of the low gain path decreases proportional to the signal amplitude. This fading method provides a gradual change of noise floor as signal amplitude varies. In addition, this fading parameter data is adjusted immediately upon the signal level being increased from −51 dB to −27 dB. The fading parameter is adjusted with a 163 ms time delay when the signal level is decreased from a 0 dB threshold to −51 dB. This time delay is slow enough to prevent subsonic and wide dynamic range signals from modulating the noise floor between the high gain and the low gain paths; yet also fast enough to mask the noise floor change during sudden signal reduction. This fading method generates a psychoacoustic masking effect to the listener. The psychoacoustic masking effect is described in U.S. Pat. No. 5,652,585, issued Jul. 29, 1997, entitled "Multiple Function Analog-to Digital Converter with Multiple Serial Outputs," which is incorporated herein by reference.

Since the signal level of the high gain path is 24 dB higher than the signal level of the low gain 0 dB path, a 24 dB increase in dynamic range is achieved. This assumes the noise contribution from the 24 dB amplifier is much smaller than the noise contribution of the analog-to-digital converter. When the digital signals from the two signal paths are combined, it is essential to ensure that the two signals are identical. Based on Fourier Transformation theory, any waveform can be constructed as the superposition of many sinusoidal waves. Four parameters describe a sine wave. They are frequency, amplitude, phase and DC offset. Given the fact that the system is essentially linear, the frequency is not changed during the data conversion from analog to digital. Therefore, it is necessary to ensure that the two paths have the same magnitude, phase and DC offset characteristics. DC offset is blocked by the high pass filter sections 339 and 343. These high pass filters are also used to reduce low frequency noise, such as wind noise, mechanical vibration noise, etc. Gain mismatch and phase mismatch between the signal paths must be corrected and this is facilitated through a calibration procedure utilizing the equalizing block 347 in addition to a calibration parameter generation block 361 which receives the digital data from the output of the high pass filter 343 and the digital data from the output from the equalizing block 347, the equalizing block 347 actually performing the correction to the data in the 0 dB path.

Whenever two digital signals are combined, any mismatch in the gain or the phase will cause a problem. Although phase mismatch itself results in less problems than gain mismatch, in very high performance analog-to-digital converters, phase calibration is essential. Furthermore, if phase mismatch is not accounted for through some type of calibration procedure, it will corrupt the gain calibration. Therefore, it is necessary to calibrate both the gain and the phase. As will be described hereinbelow, the calibration engine 361 in combination with the equalizing block 347 provides both gain and phase calibration without requiring the external training signal. It therefore virtually adapts to any wide-spectrum signal, like music, to provide for and calibrate for mismatches.

The source of gain error is due to the mismatch of various analog components in the signal path. The source of phase error is due to the mismatch of the anti-aliasing filter and the finite band of the pre-amplifiers 307 and 317 in the two respective paths. The equalizer block 347 is a digital equalizer that can adjust both gain and phase to match the phase and gain of the opposite path, the 24 dB path. The phase equalization is performed at a rate higher than the final sampling frequency. Since the frequency mapping of the analog filter to the digital filter is non-linear, the higher the digital sampling rate, the easier it is to equalize the analog response within the band of interest. However, operating the equalizer 347 at a higher rate requires high speed computation. In the preferred embodiment, the equalization is performed at a frequency of 192 kHz which has been noted as being sufficient for both a 48 kHz and a 96 kHz sampling rate, or 176.4 kHz for a 44.1 kHz sampling rate. The Z-domain equation for the equalizer is as follows:

$$\alpha \frac{(1+\varepsilon z^{-1})}{(1+0.5z^{-1})}$$

where:

"α" adjusts the magnitude;

"ε" adjust the phase

In addition to adjusting the magnitude, the parameter α also compensates for the slight magnitude change caused by "ε" when "ε" is not equal to 0.5. When there are no magnitude and phase mismatches, "α" is a value of "1" and "ε" is a value of "0.5". The decimation filter comprised of the first stage decimation filters 337 and 341 and the second stage decimation filter 357 is a Finite Impulse Response (FIR) filter, whereas the equalizer is implemented with an Infinite Impulse Response (IIR) filter design which provides better equalization in the frequency band of interest, and frequency stability is guaranteed by the poles staying inside the unit circle.

Figure 4:
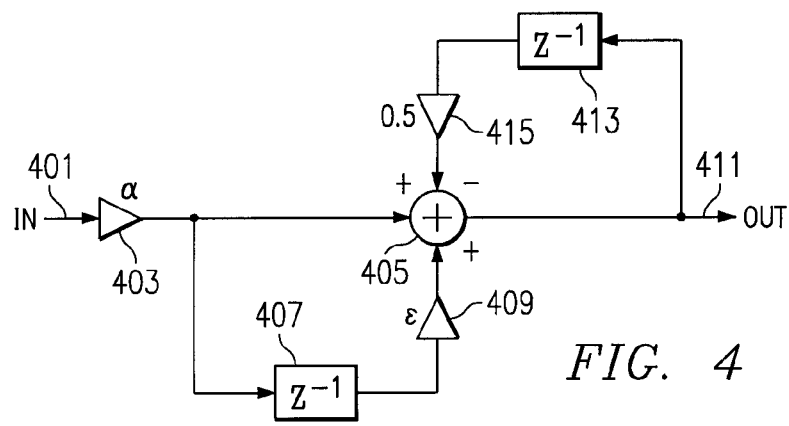
FIG. 4 illustrates a block diagram of the calibration engine.

Referring now to FIG. 4, there is illustrated a block diagram of the overall calibration engine which comprises the equalizing block 347 and the calibration parameter generation block 371. The digital signal is received on an input 401 and then the magnitude magnified by a buffer 403 that is operated on by the operator "α," the output thereof input to the positive input of summing junction 405. The output of the buffer 403 is also input to the feed-forward path through z-transform block 407 and modified by the "ε" factor with a buffer block 409. The output of buffer block 409 is input to a positive input of a summing junction 405. The output of the summing junction 405 provides on an output line 411 the calibrated output for the 0 dB path. A feedback path is also provided in which the output line 411 in input to z-transform block 413, the output of which is input to a buffer block 415 to be performed a multiplication by a factor of 0.5. The output of buffer block 415 is input to a negative input of summing block 405. The derivation for the transfer function of this calibration engine is as follows:

$$\text{out} = \alpha \cdot \text{in} + (\alpha \cdot \text{in}) \times (\varepsilon \cdot z^{-1}) - 0.5 \cdot z^{-1} \cdot \text{out}$$

$$\text{out}(1 + 0.5z^{-1}) = \alpha \cdot \text{in}(1 + \varepsilon z^{-1})$$

$$H = \frac{out}{in} = \alpha \frac{1+\varepsilon z^{-1}}{1+0.5z^{-1}}$$

Figure 5:
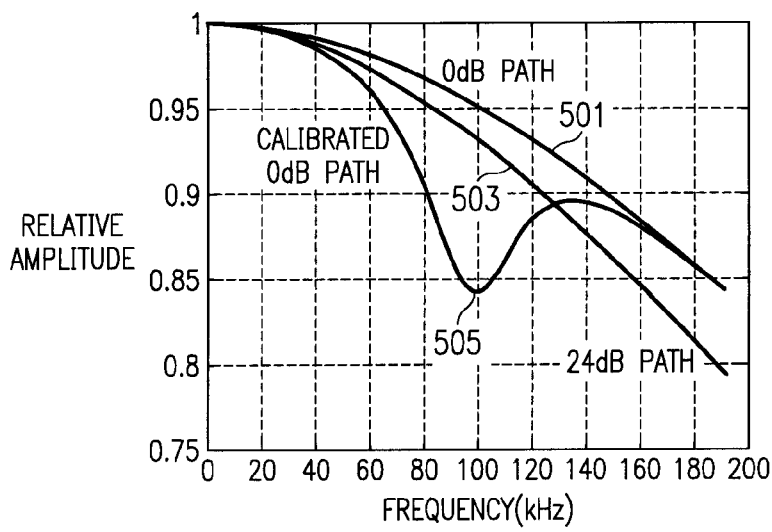
FIGS. 5 and 6 illustrate the amplitude and phase response versus frequency for the uncalibrated and calibrated A/D converter.

Referring now to FIG. 5, there is illustrated a plot of the amplitude response as a function of frequency, the frequency extending up to 200 kHz. The 24 dB path is illustrated by a plot 503. The uncalibrated 0 dB path is illustrated by a plot 501. After calibration, the 0 dB path is illustrated by a calibrated plot 505. The band of interest for the operational environment is 0–40 kHz.

Figure 6:
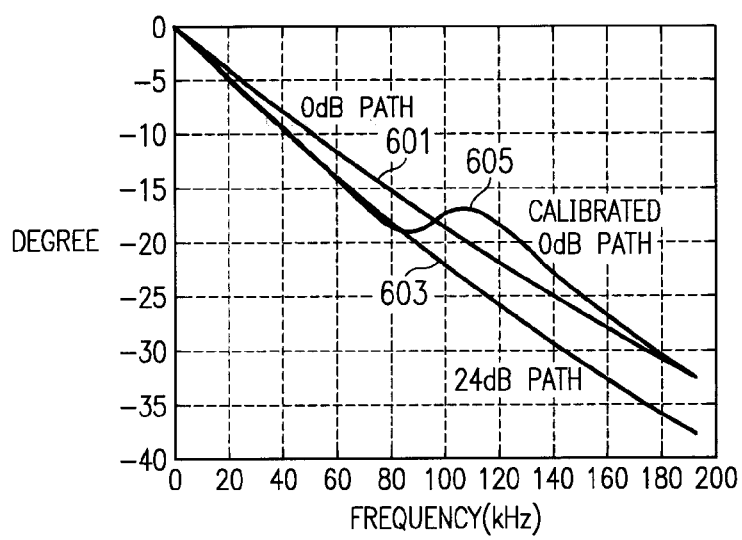
Figure 7:
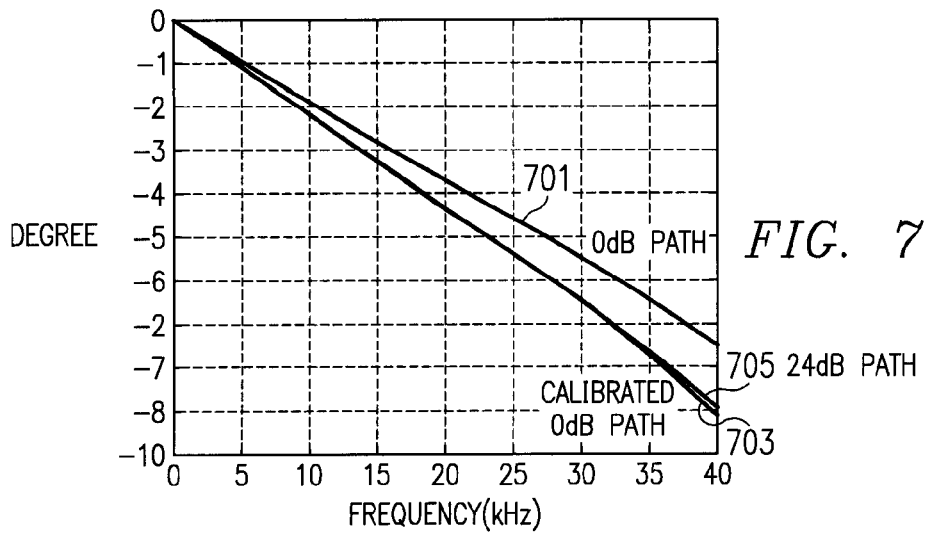
FIG. 7 illustrates the phase response of FIG. 6 over a narrower frequency range.

Referring now to FIG. 6, there is illustrated a plot of phase response versus frequency. There is provided a plot 601 representing the uncalibrated 0 dB path and a plot 603 representing the 24 dB path. The calibrated 0 dB path is illustrated by a plot 605. An expanded view of the phase response from 0 to 40 kHz, the band of interest, is illustrated in FIG. 7. FIG. 7 illustrates a plot 701 for the uncalibrated 0 dB path and the plot 703 for the calibrated 0 dB path and a plot 705 for the 24 dB path, plot 703 and 705 essentially overlapping. The pole coefficient "0.5" is optimized for the system having a signal band of 40 kHz and a data rate of 192 kHz. However, any coefficients between 0.25 and 0.75 can be utilized and performance is not degraded significantly.

Figure 8:
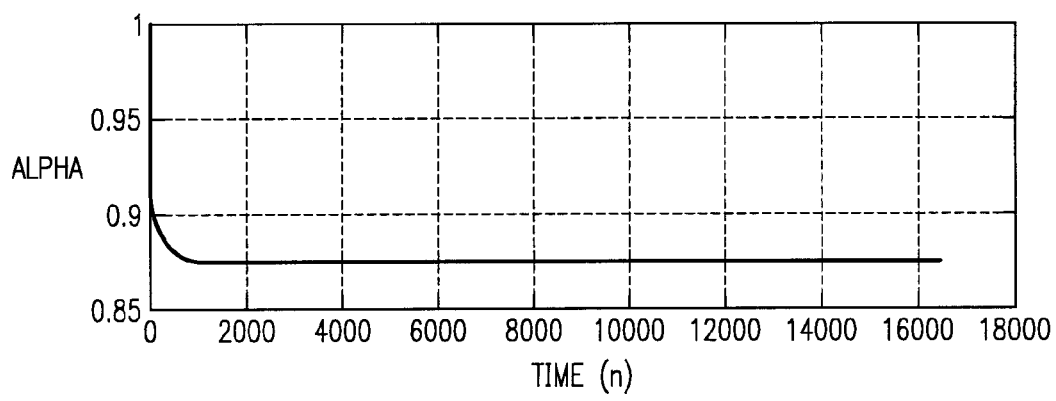
FIGS. 8 and 9 illustrate the converging process for the correction parameters.
Figure 9:
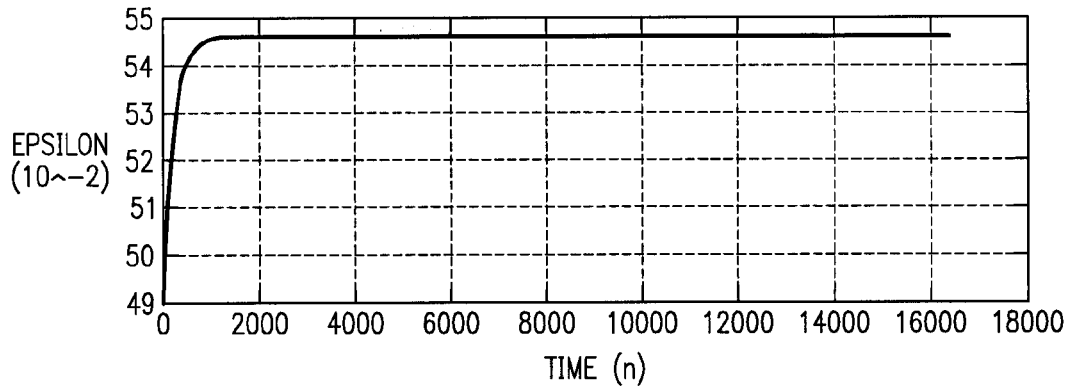

In order to determine the value of $\alpha$ and $\varepsilon$, an iteration algorithm is utilized. In general, magnitude error is measured between the two signal paths and is utilized to update the a term, and phase error is measured to update the value of $\varepsilon$. The sign of the phase error is based on the first derivative of the signal. This iteration results in a convergence operation. This convergence operation is illustrated in FIGS. 8 and 9, FIG. 8 referring to the convergence of the $\alpha$ value and FIG. 9 referring to the convergence of the $\varepsilon$ parameter. As noted above, this converging process has a sampling frequency of 192 kHz with an input signal of −30 dB, with a signal frequency of 19.9 kHz.

Figure 10:
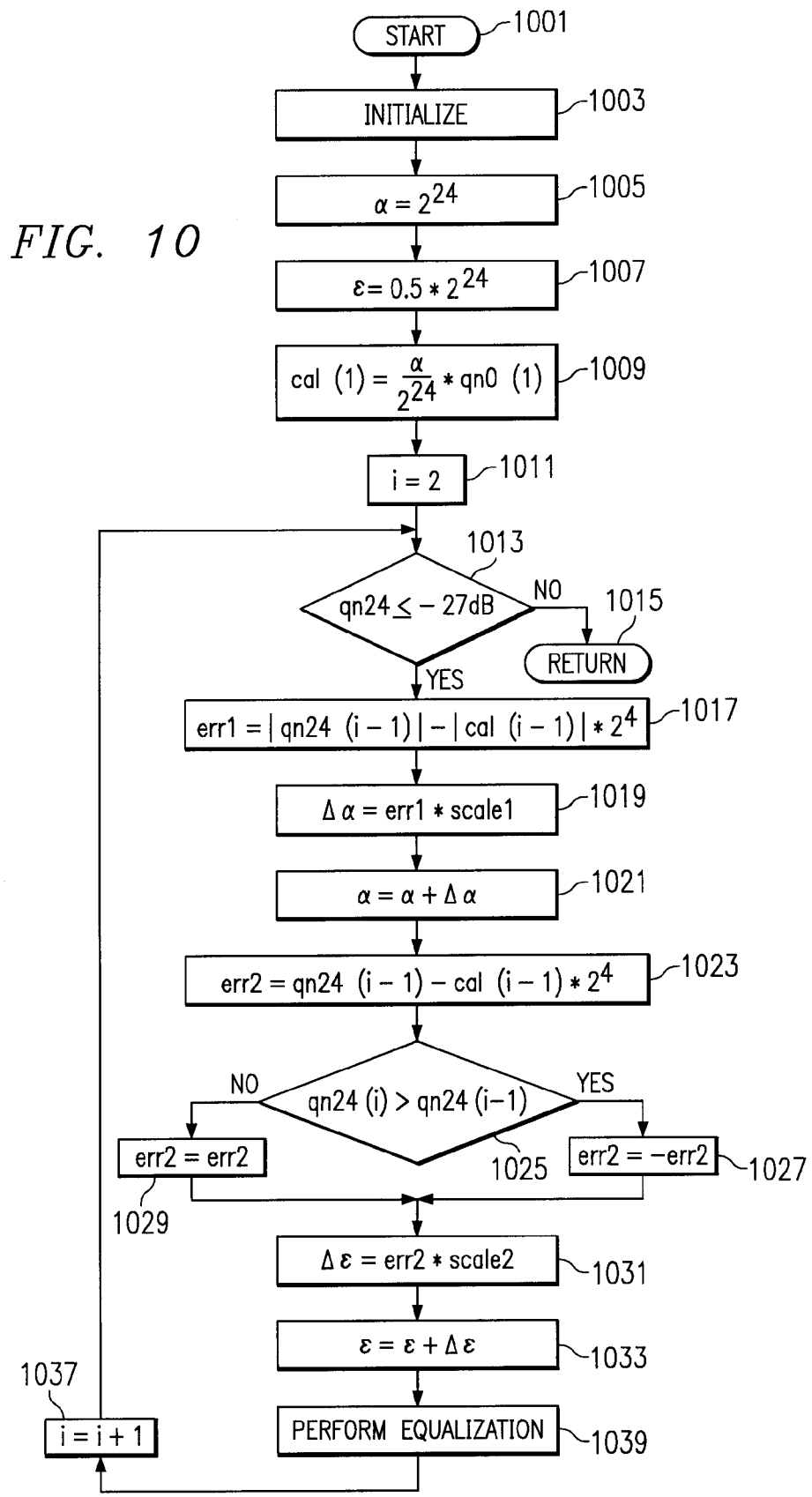
FIG. 10 illustrates a flow chart depicting the calibration operation.

Referring now to FIG. 10, there is illustrated a flow chart depicting the operation of the calibration engine of FIG. 4. The flow chart is initiated at a block 1001 and then flows to a block 1003 to initialize the operation. In the initialization operation, the value of $\alpha$ is set equal to a value of $2^{24}$, as indicated by a block 1005. The value of & is set equal to a value of 0.5 multiplied times the factor $2^{24}$, as indicated by block 1007. The output of the equalizer block 347, the "cal" output, is set equal to the product of the normalized $\alpha$ and the quantized output of the high pass filter 337, the quantized level for the 0 dB path "qn0." The equation for this initialization is as follows:

$$cal(1) = \frac{\alpha}{2^{24}} \times qn0(1)$$

This equation is for the iteration value i set equal to "1." The iteration procedure is performed from i=2 through i=∞. The above noted equation is indicated in a function block 1009.

After initialization, the program flows to a block 1011 to set the value of i=2. The program then flows to a decision block 1013 to determine if the quantized level of the 24 dB path "qn24" is less than or equal to the high threshold level for the mixing operation, −27 dB, as determined by the peak levels. If not, the program flows to a return block 1015 and, if so, the program flows along a "Y" path to a function block 1017 wherein the iteration operation for $\alpha$ is initiated. An error term is defined which is the error for the previous iteration for the magnitude of the output of the high pass filter 343 and the output of equalizer 347, as defined by the following equation:

err 1=|qn24(*i*−1)|−|cal(*i*−1)|×2⁴

The program will then flow to a function block 1019 to determine a delta value for a by multiplying the error signal err1 by scale factor scale1. The scale factor scale1 is set to $2^{-17}$. The program then flows to a function block 1021 to increase the value of a by $\Delta\alpha$. Of course, it should be understood that the value of $\Delta\alpha$ can be positive or negative.

After the value of a has been incremented, the program flows to a function block 1023 to determine a second error value, this error value being a phase error value. The phase error value is defined as a value err2 by the following equation:

err 2=qn24(*i*−1)−cal(*i*−1)×2⁴

The program then flows to a decision block 1025 to determine if the current value on the output of the high pass filter 343 in the 24 dB path is greater than the value at the previous iteration. If yes, this indicates a positive slope and the program flows along a "Y" path to a function block 1027 to set the value of err2 equal to the negative value thereof or to change the sign thereof. If the slope is negative, the program flows along the "N" path to a function block 1029 to set the value of err2 equal to the positive value thereof. Function blocks 1027 and 1029 then flows to a function block 1031 to determine a value for $\Delta\varepsilon$. This set is equal to the error value err2 multiplied by scale factor scale2. The scale value scale2 is set to $2^{-18}$. The program then flows to a function block 1033 to increment the value of $\varepsilon$ by $\Delta\varepsilon$. Of course, the value of $\Delta\varepsilon$ can be positive or negative. The program then flows to a function block 1039 to perform the equalization with the new values of $\varepsilon$ and $\alpha$ and then to a function block 1037 to set the value of i=i +1. The program then flows back to the input of the decision block 1013 to continue the operation in a continuous loop.

The routine noted hereinabove with respect to the $\alpha$ and $\varepsilon$ generation is defined hereinbelow in a matlab file format. The first file format defines various constants. The second defines the method for defining the $\alpha$ and $\varepsilon$ values.

Defining Constants fullScale=2^23; %2^23 means 2 to the 23rd power
  % This is full scale of a 24 bit data system
  % fullScale corresponds to 0dB
fade_up=round(fullScale/1.414); % upper bound for fading,
  % 24 dB path is −3 dB below fullScale
  % 0 dB path is −27 dB below fullScale
fade_low=round(fullScale/1.414/2^4); % lower bound for fading,
  % 24 dB path is −27 dB below fullScale
  % 0 dB path is −51 dB below fullScale Alpha Epsilon Generation % Alpha and Episilon generation plus equalizer
% inputs: array of peak, qn24 and qn0
% outputs: array of cal<—new qn0
  alpha=2^24;% initial alpha
  epsilon=0.5*2^24;% initial epsilon
  cal(1)=round((alpha/2^24)*qn0(1) );
  for i=2:N=∞
    % find new alpha and epsilon, error signal is generated from

```
% previous qn0 and cal
    if peak(i)<=fade_up% if peak(i) is no bigger than
         fading upper bound,
then:
% generate new alpha
    err1=abs(qn24(i-1))-abs(cal(i-1))*2^4;
    delAlpha=round(err1*scale1);% scale1 is set to 2^(-17)
    alpha—alpha+delAlpha;
    % generate new epsilon
    err2=qn24(i-1)-cal(i6-1)*2^4;
    if qn24(i)>qn24(i-1)
        err2=err2;
    else
        err2=err2;
    end
    del Epround(err2*scale2);% scale2 is set to 2^(-18)
    epsilon=epsilon+delEp;
end% if peak(v)<=fade_up
% do equalization
call=qn0(i)+(epsilon/2^24)*qn0(i-1);
    cal(i)=round((alpha/2^24)*call-0.5*cal(i-1));
end% for i=2:N
```

The peak detector 359 in FIG. 3 is a detector that basically examines the peak value of the signal output from the high pass filter 343, the qn24 signal, and determines the peak value thereof. In the process of determining the peak value, there is also provided a decay factor. This is referred to as a "leak" factor. In general, this is a factor that is equal to the previous peak value scaled by a factor of $2^{-15}$. This value is subtracted from the previous peak value whenever a new and greater peak value is not found. The peak detector 359 is also operable to determine the β value. This is a value that is set equal to zero whenever the peak value is above the −27 dB signal, the upper bound for fading and 1 if it is less than the lower scale value, −51 dB. If it is in between the two bounds, it is equal to the difference between the upper bound and the peak signal level divided by the difference between the upper and lower bounds. This is defined in the following matlab file:

Peak Detector And Beta Generator

```
% peak detector and beta generater
% inputs: array of qn24
% outputs: array of peak and
    absqn24=abs(qn24);
    peak(1)=0;% initialize peak
    leak=0;% initialize leak
for i=2: N% N=∞
    % peak detector
    a=peak(i-1)-leak;
    if a<=absqn24(i)
        peak(i)=absqn24(i);
    else
        peak(i)=a;
    end
    leak=peak(i)/2^15;
    % beta generator
    if peak(i)>=fade_up
        beta(i)=0;
    elseif peak(i)<=fade_low
        beta(i)=1;
    else% fade_low<peak<fade_up
        beta(i)=(fade_up-peak(i))/(fade_up-fade low);
    end
end% for i=2:N
```

In summary, there has been provided a method and apparatus for converting an analog microphone output to a digital value for use in an audio processing system. A gain ranging A/D converter is provided which defines at least two paths, a low gain path and a high gain path. A threshold detector is provided for determining when the signal is above a high threshold or below a low threshold. If it is above the high threshold value, the low gain path is utilized, and if it is below the low gain threshold, the high gain path is utilized. In between the upper and lower thresholds is an area defined wherein the signals from the two paths are mixed in a "fading" parameter. When the two signals are mixed, the gain is calibrated to ensure that the gain of the two signals differs by the gain difference between the two paths. In addition, the phase of the two signals is also matched to account for any phase mismatch that exists between the two paths.

Although the preferred embodiment has been described in detail, it should be understood that various changes, substitutions and alterations can be made therein without departing from the spirit and scope of the invention as defined by the appended claims.

What is claimed is:

1. A digital microphone system, comprising:

a microphone transducer for receiving an audible input signal and converting it to an analog signal; and a digital processing system for converting said analog signal to a digital signal and processing the digital signal in the digital domain with a conversion gain, said digital processing system during the conversion of said analog signal to said digital signal operable to detect the magnitude of the audible input signal and vary said conversion gain as a function of the magnitude of the audible input signal, and wherein said digital processing system includes the operation of combining at least two digital signals prior to said conversion gain being varied to yield a resulting digital signal, with the combining operation including a phase equalization operation performed between the two combined signals to minimize distortion in the resulting digital signal.

2. The digital microphone system of claim 1, and further comprising an audio processing system for receiving the resulting digital output of said digital processing system and converting it to an audible output signal.

3. The digital microphone system of claim 2, wherein said digital processing system is operable to detect the magnitude of the audible input signal in the digital domain.

4. A digital microphone system, comprising:

a microphone transducer for receiving an audible input signal and converting it to an analog signal; and a digital processing system for converting said analog signal to a digital signal and processing the digital signal in the digital domain with a conversion gain, said digital processing system during the conversion of said analog signal to said digital signal operable to detect the magnitude of the audible input signal and vary said conversion gain as a function of the magnitude of the audible input signal, and wherein said digital processing system includes the operation of combining at least two digital signals to yield a resulting digital signal, with the combining operation including a phase equalization operation performed between the two combined signals to minimize distortion in the resulting digital signal;

wherein said digital processor includes an analog-to-digital (A/D) converter for performing the conversion of said analog signal to said digital signal, said A/D converter including:
a high gain path for receiving the input analog signal and imparting a first gain thereto;
a low gain path for receiving the input analog signal and imparting a second gain thereto, said second gain lower than said first gain;
a gain varying device for varying the gain in at least one of said paths relative to the other of said paths;
a summing device for summing the output of said high gain path and said low gain path;
a device for controlling the operation of said gain varying device to determine the amount of signal to be summed from each of said high and low gain paths in accordance with a predetermined summing profile; and
an equalizer for adjusting the phase between said high and low gain paths to minimize distortion in the resulting signal.

5. The digital microphone system of claim 4, wherein said predetermined summing profile operates in accordance with an algorithm which is operable to:
select only the signal from of said high gain path with substantially no gain adjustment if the signal level is detected as being below a low signal threshold;
select the signal out of only said low gain path if the detected signal is above a high signal threshold, said low signal threshold lower than said high signal threshold; and
blend the signal from said high gain path and said low gain path if the detected signal is between said high signal threshold and said low signal threshold in accordance with a predetermined blending algorithm.

6. The digital microphone system of claim 5, wherein said blending portion of the algorithm operates in accordance with the following equation:

$$D_{out} = \beta \times D_{HG} + (1-\beta) \times D_{LG}$$

where
$D_{out}$ is the composite digital signal,
$\beta$ is a fading parameter that varies from a value of zero to one,
$D_{HG}$ is the digital data on the high gain path, and
$D_{LG}$ is the digital data on the low gain path.

7. The digital microphone system of claim 4, wherein said equalizer is disposed in said low gain path.

8. The digital microphone system of claim 7, wherein said equalizer operates in accordance with the following equation:

$$\alpha \frac{(1 + \varepsilon z^{-1})}{(1 + 0.5 z^{-1})}$$

where:
"$\alpha$" adjusts the magnitude;
"$\varepsilon$" adjust the phase;
and wherein the value of $\alpha$ is equal to "1" and is $\varepsilon$ equal to "0.5" for no magnitude and phase mismatches between the signal in said high gain path and the signal in said low gain path.

9. A gain ranging analog-to-digital (A/D) converter, comprising:
a high gain conversion path for receiving an analog input signal and converting it to a digital signal with a first gain;
a low gain path for receiving the analog input signal and converting it to a digital signal with a second gain, said second gain lower than said first gain;
a gain varying device for varying the gain in at least one of said paths relative to the other of said paths;
a summing device for summing the output of said high gain path and said low gain path;
a device for controlling said gain varying device to determine the amount of signal to be summed from each of said high and low gain paths in accordance with a predetermined summing profile; and
an equalizer for adjusting the phase between said high and low gain paths to minimize distortion in the resulting signal.

10. The A/D converter of claim 9, wherein the A/D converter is comprised of an analog section and a digital section, wherein:
said analog section includes first and second analog modulators for being disposed in said high and low gain paths; and
said digital section includes said gain varying device, said controller and said equalizer.

11. The A/D converter of claim 10, wherein said analog modulators are delta-sigma analog modulators.

12. The A/D converter of claim 10, wherein said analog section includes first and second low pass filters in said high and low gain paths preceding said associated analog modulator.

13. The A/D converter of claim 12, wherein said first and second low pass filters are each comprised of discrete devices.

14. The A/D converter of claim 12, wherein said first and second low pass filters are each comprised of an RC network.

15. The A/D converter of claim 10, wherein said digital section includes a digital filter, said digital filter comprising a decimation filter and a high pass filter section.

16. The A/D converter of claim 15, wherein said decimation filter includes a first stage of decimation filtering disposed in each of first and second paths prior to said equalizer and further including a second stage of decimation filtering disposed after summation by said summing device.

17. The A/D converter of claim 10, wherein said predetermined summing profile operates in accordance with an algorithm which is operable to:
select only the signal from said high gain path with substantially no gain adjustment if the signal level is detected as being above a high signal threshold;
select the signal out of only said low gain path if the detected signal is below a low signal threshold, said low signal threshold lower than said high signal threshold; and
blending the signal from said high gain path and said low gain path if the detected signal is between said high signal threshold and said low signal threshold in accordance with a predetermined blending algorithm.

18. The A/D converter of claim 17, wherein said blending algorithm operates in accordance with the following equation:

$$D_{out} = \beta \times D_{HG} + (1-\beta) \times D_{LG}$$

where
$D_{out}$ is the composite digital signal,
$\beta$ is a fading parameter that varies from a value of zero to one, $D_{HG}$ is the digital data on the high gain path, and
$D_{LG}$ is the digital data on the low gain path.

19. The A/D converter of claim 10, wherein said equalizer is disposed in said low gain path.

20. The A/D converter of claim 19, wherein said equalizer operates in accordance with the following equation:

$$\alpha \frac{(1+\varepsilon z^{-1})}{(1+0.5z^{-1})}$$

where:
"α" adjusts the magnitude;
"ε" adjust the phase;
and wherein the value of α is equal to "1" and ε is equal to "0.5" for no magnitude and phase mismatches between the signal in said high gain path and the signal in said low gain path.

21. A method for digitally processing information in a microphone system, comprising:
receiving at a microphone transducer an audible input signal and converting it to an analog signal;
converting in a digital processing system the analog signal to a digital signal; and
processing the digital signal in the digital domain with a conversion gain, wherein the step of converting during the conversion of the analog signal to the digital signal operable to detect the magnitude of the audible input signal and vary the conversion gain as a function of the magnitude of the audible input signal, and wherein the step of converting includes the step of combining at least two digital signals prior to the step of varying the conversion gain to yield a resulting digital signal, with the combining operation including a phase equalization operation performed between the two combined signals to minimize distortion in the resulting digital signal.

22. The method of claim 21, and further comprising the step of receiving in an audio processing system the resulting digital output of the step of converting and converting it to an audible output signal.

23. The method of claim 22, wherein the step of converting is operable to detect the magnitude of the audible input signal in the digital domain.

24. A method for digitally processing information in a microphone system, comprising:
receiving at a microphone transducer an audible input signal and converting it to an analog signal;
converting in a digital processing system the analog signal to a digital signal; and
processing the digital signal in the digital domain with a conversion gain, wherein the step of converting during the conversion of the analog signal to the digital signal operable to detect the magnitude of the audible input signal and vary the conversion gain as a function of the magnitude of the audible input signal, and wherein the step of converting includes the step of combining at least two digital signals to yield a resulting digital signal, with the combining operation including a phase equalization operation performed between the two combined signals to minimize distortion in the resulting digital signal;
wherein the step of converting includes the step of performing the conversion of the analog signal to the digital signal with an analog-to-digital (A/D) converter, including the steps of:
providing a high gain path for receiving the input analog signal and imparting a first gain thereto;
providing a low gain path for receiving the input analog signal and imparting a second gain thereto, the second gain lower than the first gain;
varying the gain in at least one of the paths relative to the other of the paths;
summing the output of the high gain path and the low gain path;
controlling the operation of the step of varying to determine the amount of signal to be summed from each of the high and low gain paths in accordance with a predetermined summing profile; and
adjusting the phase between the high and low gain paths to minimize distortion in the resulting signal.

25. The method of claim 24, wherein the predetermined summing profile operates in accordance with an algorithm which is operable to:
select only the signal from of the high gain path with substantially no gain adjustment if the signal level is detected as being below a low signal threshold;
select the signal out of only the low gain path if the detected signal is above a high signal threshold, the low signal threshold lower than the high signal threshold; and
blend the signal from the high gain path and the low gain path if the detected signal is between the high signal threshold and the low signal threshold in accordance with a predetermined blending algorithm.

26. The method of claim 25, wherein the blend step operates in accordance with the following equation:

$$D_{out}=\beta \times D_{HG}+(1-\beta) \times D_{LG}$$

where
$D_{out}$ is the composite digital signal,
β is a fading parameter that varies from a value of zero to one,
$D_{HG}$ is the digital data on the high gain path, and
$D_{LG}$ is the digital data on the low gain path.

27. The method of claim 24, wherein the step of adjusting the phase operates in the low gain path.

28. The method of claim 27, wherein the step of adjusting the phase operates in accordance with the following equation:

$$\alpha \frac{(1+\varepsilon z^{-1})}{(1+0.5z^{-1})}$$

where:
"α" adjusts the magnitude;
"ε" adjust the phase;
and wherein the value of α is equal to "1" and is ε equal to "0.5" for no magnitude and phase mismatches between the signal in the high gain path and the signal in the low gain path.

29. A gain ranging method for application in an analog-to-digital (A/D) converter, comprising the steps of:
receiving an analog input signal in a high gain conversion path and converting it to a digital signal with a first gain;
receiving the analog input signal in a low gain path and converting it to a digital signal with a second gain, the second gain lower than the first gain;
varying the gain with a gain varying device in at least one of the paths relative to the other of the paths;
summing the output of the high gain path and the low gain path;

controlling the gain varying device to determine the amount of signal to be summed from each of the high and low gain paths in accordance with a predetermined summing profile; and adjusting the phase between the high and low gain paths to minimize distortion in the resulting signal.

30. The method of claim 29, wherein the A/D converter is comprised of an analog section and a digital section, including the steps of:

disposing the analog section including first and second analog modulators in the high and low gain paths; and performing the steps of varying, controlling and adjusting in the digital section.

31. The method of claim 30, wherein the analog modulators are delta-sigma analog modulators.

32. The method of claim 30, wherein the analog section includes first and second low pass filters in the high and low gain paths preceding the associated analog modulator.

33. The method of claim 30, wherein the predetermined summing profile operates in accordance with an algorithm which is operable to:

select only the signal from of the high gain path with substantially no gain adjustment if the signal level is detected as being above a high signal threshold;

select the signal out of only the low gain path if the detected signal is below a low signal threshold, the low signal threshold lower than the high signal threshold; and blend the signal from the high gain path and the low gain path if the detected signal is between the high signal threshold and the low signal threshold in accordance with a predetermined blending algorithm.

34. The method of claim 33, wherein the blend step operates in accordance with the following equation:

$$D_{out} = \beta \times D_{HG} + (1-\beta) \times D_{LG}$$

where $D_{out}$ is the composite digital signal, $\beta$ is a fading parameter that varies from a value of zero to one, $D_{HG}$ is the digital data on the high gain path, and $D_{LG}$ is the digital data on the low gain path.

35. The method of claim 30, wherein the step of adjusting the phase operates in the low gain path.

36. The method of claim 35, wherein the step of adjusting the phase operates in accordance with the following equation:

$$\alpha \frac{(1+\varepsilon z^{-1})}{(1+0.5z^{-1})}$$

where:

"$\alpha$" adjusts the magnitude;

"$\varepsilon$" adjust the phase;

and wherein the value of $\alpha$ is equal to "1" and $\varepsilon$ is equal to "0.5" for no magnitude and phase mismatches between the signal in the high gain path and the signal in the low gain path.

* * * * *